United States Patent [19]

Treharne et al.

[11] Patent Number: 4,559,206
[45] Date of Patent: Dec. 17, 1985

[54] ARC REACTOR FOR FERTILIZER MANUFACTURE

[75] Inventors: Richard W. Treharne, Xenia; Charlton K. McKibben, Huber Heights; Donald R. Moles, Yellow Springs, all of Ohio

[73] Assignee: Battelle Development Corporation, Columbus, Ohio

[21] Appl. No.: 664,909

[22] Filed: Oct. 26, 1984

[51] Int. Cl.⁴ .............................................. C01B 21/32
[52] U.S. Cl. ............................. 422/186.24; 204/179; 422/186; 422/186.21; 422/904
[58] Field of Search ............. 422/904, 186.21, 186.23, 422/186.24, 186, 186.26, 186.22, 905, 186.04; 204/178, 179, 177

[56] References Cited
U.S. PATENT DOCUMENTS

| 1,232,179 | 7/1917 | Barfoed | 422/904 |
|---|---|---|---|
| 1,453,435 | 5/1923 | Buettner | 422/904 |
| 1,992,566 | 2/1934 | Briner et al. | 422/904 |
| 2,069,226 | 2/1937 | Curtis | 422/186.24 |
| 2,525,938 | 10/1950 | Peck | 422/904 |
| 4,010,897 | 3/1977 | Treharne et al. | 204/179 |
| 4,256,967 | 3/1981 | Treharne et al. | 422/904 |

Primary Examiner—Stephen J. Lechert, Jr.
Assistant Examiner—Howard J. Locker
Attorney, Agent, or Firm—Benjamin Mieliulis

[57] ABSTRACT

An improved arc reactor device is disclosed for producing nitrogen oxides by an electric discharge process wherein the improvement is the addition of an igniter electrode and circuit responsive to the discharge electrode voltage causing arcing of the igniter electrode when the discharge electrode voltage rises to a set level.

6 Claims, 2 Drawing Figures

ARC REACTOR FOR FERTILIZER MANUFACTURE

FIELD OF THE INVENTION

The present invention relates to an improved device for the production of fixed nitrogen and, more particularly, to an improved device for producing nitrogen oxides by an electric arc discharge process.

Nitrogen is an essential material in the production of fertilizers. While it is a major component of the atmosphere (79 percent in dry air), nitrogen can be incorporated into most living systems only in the "fixed" form and nitrogen is less abundant in its fixed form. Typically, chemical fertilizers contain nitrogen which is fixed by industrial methods in which nitrogen is combined with hydrogen derived from petroleum feedstocks or natural gas.

Especially in underdeveloped regions of the world, alternative processes to those dependent upon petroleum or natural gas feedstocks for producing fixed nitrogen fertilizers would help to satisfy the growing worldwide demand for fixed nitrogen fertilizers.

DESCRIPTION OF RELATED ART

Treharne et. al. (U.S. Pat. No. 4,256,967) discloses an arc reactor device for producing nitrogen oxides by an electric arc discharge process. Treharne, supra, also an inventor herein, disclosed an electrically conductive casing defining an arc discharge chamber. An electrically conductive discharge electrode was electrically insulated from the casing and extended into the chamber. An electric power source means was provided for applying an arc discharge potential between the discharge electrode and the casing, a ground electrode. A starter electrode extended into the chamber. The starter electrode was designed movable from an extended position in which it contacts the discharge electrode to a retracted position in which it is out of contact with the discharge electrode.

The Treharne reactor has been found to be an effective means of fixating nitrogen by producing nitrogen oxides from air. With the addition of water, these nitrogen oxides form dilute nitric acid solutions.

The Treharne reactor incorporated a mechanical starter electrode movable from a position of contact with the discharge electrode to a retracted position out of contact with the discharge electrode. With time the starter electrode has a tendency to corrode making arc or spark initiation by mechanical contact subject to repeated to instances of failure to initiate a spark. Often several strikes are necessary to initiate sparking. A high air flow or turbulent flow through the arc reactor can cause the arc to be blown out and extinguished. In the event the arc between the discharge electrode and casing becomes extinguished, restriking of the starter electrode by contact with the discharge electrode is necessary.

Treharne addressing the need to restrike the arc taught a solenoid actuator for moving the starter electrode. The solenoid actuator withdraws the starter electrode from the extended position to the retracted position as the arc discharge potential is applied between the discharge electrode and the casing. The d.c. power source included a first power output terminal connected to the discharge electrode, and a second power output terminal connected to the casing through a resistor. The solenoid actuator included a solenoid coil connected electrically parallel with the resistor. When the coil was energized, the actuator moved the starter electrode to its retracted position.

With age, mechanical components become increasingly unreliable in spark initiation. Also, if the solenoid actuator hesitates in arc striking, the starter electrode can stick to the discharge electrode.

A need exists for a more reliable and preferably automatic non-mechanical system of initiating and maintaining the spark in the arc reactor.

It is an object of the present invention to disclose an improved arc discharge reactor and more specifically to disclose an arc discharge reactor having an electronic starter electrode.

SUMMARY OF THE INVENTION

Figure 1:
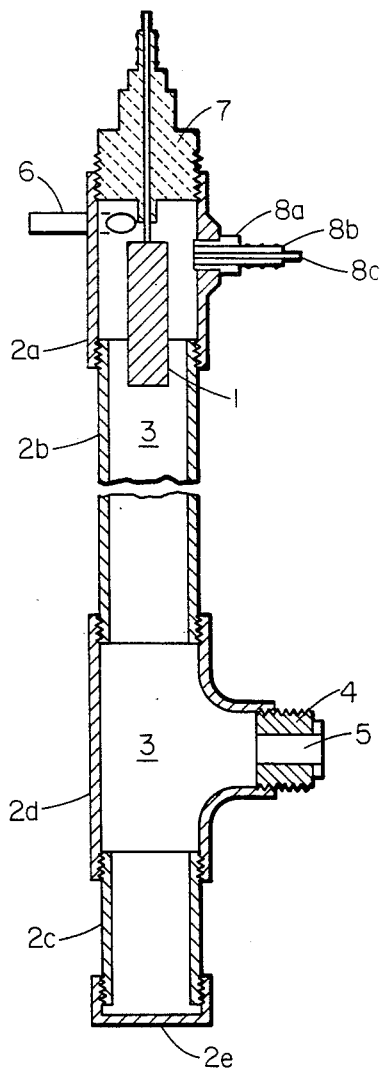
FIG. 1 is a side cross-sectional view of an arc reactor device according to this invention.

An arc reactor discharge device for producing nitrogen oxides by an arc discharge process comprises an electrically conductive casing defining an arc discharge chamber, and having inlet opening means and outlet opening means communicating with said chamber. An electrically conductive discharge electrode is electrically insulated from the casing and extends into the chamber.

An igniter electrode is electrically insulated from the casing and extends into the casing proximate the discharge electrode. The igniter electrode, while of same polarity as the discharge electrode, has a smaller exposed surface area in the chamber and is positioned nearer the grounded casing than is the discharge electrode. Being of smaller surface area and closer to the casing, smaller impressed electrical potential is necessary to trigger discharge of the igniter electrode as compared to the initial potential required to cause electrical discharge or arcing via the discharge electrode.

When the igniter electrode arcs to the casing, ionization of the air molecules occurs in the immediate vicinity of the discharge electrode and casing enabling an electrical breakdown i.e. arc from the discharge electrode to the casing to be initiated at a lower potential than would be the case in non-ionized air.

It is desirable, to preserve the useful life of the igniter electrode, to provide circuitry to turn off the igniter electrode once the discharge electrode is arcing.

The present invention discloses an improved arc reactor device for fixating nitrogen of the type wherein a discharge electrode and electrical ground is provided within a chamber defined by a casing, a voltage is impressed between the discharge electrode and the ground to sustain an arc, the chamber has air inlet and outlet means for injection of air and movement of said air through said arc for the formation of nitrogen oxides, wherein the improvement comprises an igniter electrode electrically insulated from the casing extending into the chamber proximate to the discharge electrode. The igniter electrode is of smaller surface area than said discharge electrode and the igniter electrode is positioned closer to the electrical ground than the discharge electrode.

A circuit means responsive to the discharge electrode voltage is provided for switching high voltage d.c. from the discharge electrode to the igniter electrode when the discharge electrode voltage increases. The circuit means responsive to the discharge electrode voltage can be such as to cause arcing of the igniter electrode when the discharge electrode voltage increases to a set high voltage and cause arcing of the igniter electrode to cease when the discharge electrode voltage drops from the set high voltage. Preferably the circuit means responsive to the discharge electrode voltage causes arcing of the igniter electrode when the discharge electrode voltage increases to approximately 3000 volts and causes arcing of the igniter electrode to cease when the discharge electrode voltage drops to approximately 1000 volts due to arcing of the discharge electrode.

DETAILED DESCRIPTION

Figure 2:
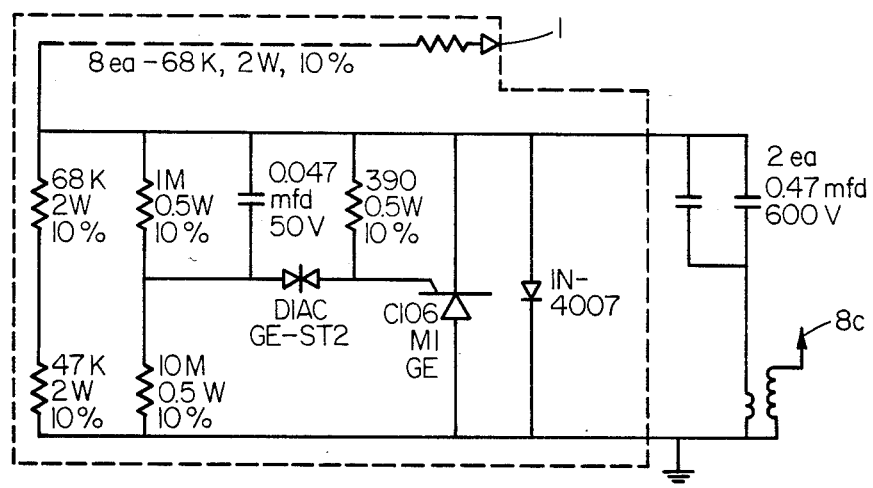
FIG. 2 depicts a resistance capacitative oscillator type electrical circuit which switches high voltage d.c. from the discharge electrode 1 to the igniter electrode 8c and later extinguishes the igniter electrode based upon the voltage drop which occurs between the discharge electrode and casing once an arc is sustained.

Reference is made to FIGS. 1-2 which illustrate the arc reactor device of the present invention. An electrically conductive casing 2 defines an arc discharge chamber 3. Chamber 3 is preferably cylindrical. Inlet opening means 6 and outlet opening means 5 are provided which communicate with chamber 3 and provide a means of supplying air to chamber 3 for the generation of nitrogen oxides and removing the air and nitrogen oxide mixture from the chamber 3, respectively.

Casing 2 is comprised of connected threaded pipe sections 2a, 2b, 2c and threaded T-pipe section 2d. FIG. 1 depicts threaded end cap 2e. Outlet opening means 5 is depicted as plug 4 having a drilled passageway orientated perpendicular to chamber 3 and optionally at some distance from end cap 2e, so as to enlarge chamber 3, create some turbulence in the air flow and increasing residence time in the reactive chamber 3. End cap 2e also functions as a convenient clean out access means.

Discharge electrode 1 is within chamber 3 held in position and insulated from the conductive casing by insulator 7. Igniter electrode 8 is positioned proximate to discharge electrode 1 preferably perpendicular thereto. Igniter electrode 8 is comprised of a metallic threaded section 8a screwed into casing 2, an insulator 8b, and an electrode 8c. The igniter electrode 8 is commonly referred to as a spark plug. As is well known in the art, a spark plug available commercially generally has a positive center electrode insulated from a negative L-shaped electrode extending from the grounded metallic threaded section. In this invention, it is advantageous if the grounded L-shaped electrode is removed from the spark plug and the spark plug's center electrode functions as the igniter electrode arcing to the grounded metallic threaded section.

A power source means, including a d.c. power source is used to apply an arc discharge potential between discharge electrode 1 and casing 2, thereby producing electrical arcing between electrode 1 and casing 2 to form nitrogen oxides from air supplied to chamber 3 through inlet opening means 6. To create air flow a pump can be used to either inject air into chamber 3 or to evacuate the air and nitrogen oxide mixture from chamber 3. Air injection is preferred at 70-100 liters per minute.

The d.c. power source means may comprise a current limit power source supplying a maximum potential of 3000 volts at no load and 1000 volts at 3 amps. The power source may be current limited such that no more than 3 amps may be supplied by the power source to the arc reactor device.

The power supply means is used to provide power to sustain the arc between discharge electrode 1 and casing 2, and is connected in parallel via a resistance capacitative oscillator or rc timing circuit to the igniter electrode. To initiate or restart the arc, the circuit via igniter electrode 8 is used.

It is desirable to preserve the useful life of the igniter electrode to provide circuitry to extinguish the igniter electrode once the discharge electrode is arcing. The present invention discloses a circuit to extinguish the igniter electrode based upon the voltage drop which occurs between the discharge electrode and casing once an arc is sustained. A voltage of approximately 3000 volts impressed prior to a spark between the discharge electrode and casing immediately drops to approximately 1000 volts or less when an arc occurs. With the circuitry of the present invention the igniter electrode sparks when approximately 3000 volts is impressed between the discharge electrode and casing, and the igniter electrode ceases sparking when the impressed voltage between the discharge electrode and casing drops to approximately 1000 volts.

The starter electrode, such as for example, depicted in FIG. 1 prevents sparking at the igniter electrode when an arc is present between the discharge electrode 1 and the casing 2. The circuit is basically an oscillator with its output controlling a silicon controlled rectifier that switches high voltage d.c. from the power source to the coil capacitor, typically an automobile ignition coil, leading to the igniter electrode.

The igniter electrode 8 in arcing to casing 2 ionizes the air proximate the discharge electrode 1 enabling the discharge electrode to arc through the ionized air to casing 2.

With no load, the main arc voltage (at the discharge electrode 1) is approximately 3000 volts. The circuit of FIG. 2 is a means for sensing or reacting to a voltage drop at the discharge electrode 1 when an arc is established and discontinuing the arc at the igniter electrode 8.

If the arc at the discharge electrode becomes extinguished, the main arc voltage climbs to approximately 3000 volts and the oscillator circuit of FIG. 2 causes the voltage at the igniter electrode 8 to climb to an amount sufficient to cause discharge.

We claim:

1. An improved arc reactor device for fixating nitrogen of the type wherein a discharge electrode and electrical ground is provided within a chamber defined by a casing, a voltage is impressed between the discharge electrode and the ground to sustain an arc, the chamber has air inlet and outlet means for injection of air and movement of said air through said arc for the formation of nitrogen oxides, wherein the improvement comprises
 a stationary igniter electrode electrically insulated from the casing extending into the chamber proximate to the discharge electrode, said igniter electrode being of smaller surface area than said discharge electrode, and said igniter electrode being positioned closer to the electrical ground than said discharge electrode.

2. The improved arc reactor device according to claim 1 including in addition
 a means responsive to the discharge electrode voltage for switching high voltage d.c. from the discharge electrode to the igniter electrode when the discharge electrode voltage increases.

3. The means responsive to the discharge electrode voltage according to claim 2 wherein switching to the igniter electrode occurs when the discharge electrode voltage increases to approximately 3000 volts.

4. The improved arc reactor device according to claim 1 including in addition
a means responsive to the discharge electrode voltage causing arcing of the igniter electrode when the discharge electrode voltage increases to a set high voltage and causing arcing of the igniter electrode to cease when the discharge electrode voltage drops from the set high voltage.

5. The improved arc reactor device according to claim 1 including in addition
a means responsive to the discharge electrode voltage causing arcing of the igniter electrode when the discharge electrode voltage increases to approximately 3000 volts and causing arcing of the igniter electrode to cease when the discharge electrode voltage drops to approximately 1000 volts.

6. The improved arc reactor device according to claim 5 wherein the igniter electrode is the center electrode of a spark plug.

* * * * *